United States Patent
Isomura et al.

(10) Patent No.: US 11,276,791 B2
(45) Date of Patent: Mar. 15, 2022

(54) EDGE INCIDENT TYPE SEMICONDUCTOR LIGHT RECEIVING DEVICE

(71) Applicant: KYOTO SEMICONDUCTOR CO., LTD., Kyoto (JP)

(72) Inventors: Takatomo Isomura, Kyoto (JP); Etsuji Omura, Kyoto (JP)

(73) Assignee: KYOTO SEMICONDUCTOR CO., LTD., Kyoto (JP)

( * ) Notice: Subject to any disclaimer, the term of this patent is extended or adjusted under 35 U.S.C. 154(b) by 0 days.

(21) Appl. No.: 16/981,634

(22) PCT Filed: Jun. 4, 2020

(86) PCT No.: PCT/JP2020/022097
§ 371 (c)(1),
(2) Date: May 6, 2021

(87) PCT Pub. No.: WO2021/245874
PCT Pub. Date: Dec. 9, 2021

(65) Prior Publication Data
US 2021/0384365 A1    Dec. 9, 2021

(51) Int. Cl.
*H01L 31/0232* (2014.01)
*G01J 1/04* (2006.01)
*H01L 31/103* (2006.01)

(52) U.S. Cl.
CPC ...... *H01L 31/02327* (2013.01); *G01J 1/0411* (2013.01); *H01L 31/1037* (2013.01)

(58) Field of Classification Search
CPC ........ H01L 31/02327; H01L 31/035281; G01J 1/0411
See application file for complete search history.

(56) References Cited

U.S. PATENT DOCUMENTS

| | | |
|---|---|---|
| 2003/0086653 A1 | 5/2003 | Kuhara |
| 2020/0161492 A1* | 5/2020 | Vawter ................. G02B 6/4214 |
| 2020/0168749 A1 | 5/2020 | Nishimura et al. |

FOREIGN PATENT DOCUMENTS

| | | |
|---|---|---|
| JP | H-0315907 U | 2/1991 |
| JP | 3152907 B | 4/2001 |
| JP | 2003-142699 A | 5/2003 |
| JP | 2004-241764 A | 8/2004 |
| WO | 2019/021362 A1 | 1/2019 |

* cited by examiner

*Primary Examiner* — Suberr L Chi
(74) *Attorney, Agent, or Firm* — Norris McLaughlin, P.A.

(57) ABSTRACT

In an edge incident type semiconductor light receiving device that reflects light incident parallel to the main surface of the semiconductor substrate opaque to the incident light to the light receiving section on the main surface side, a light guide section is formed to expose the light receiving section along the light incident direction from the light incident side end of the semiconductor substrate, and in order to guide the light incident on the light guide section to the light receiving section, a light reflection section having a given crossing angle with the main surface is provided at the end of the light guide section in the light incident direction.

3 Claims, 10 Drawing Sheets

EDGE INCIDENT TYPE SEMICONDUCTOR LIGHT RECEIVING DEVICE

TECHNICAL FIELD

The present invention relates to an edge incident type semiconductor light receiving device suitable for a surface mounting type light receiving module.

BACKGROUND ART

In the field of optical communication, in order to cope with a rapid increase in communication volume, development is underway to increase the transmission speed. In optical communication, optical signals are transmitted from a transmitting side through an optical fiber cable, and a receiving side converts optical signals received by a semiconductor light receiving device of a light receiving module into electric signals. The light receiving module preferably has accurate and easy alignment between the optical fiber cable and the semiconductor light receiving device, and a surface mounting type light receiving module that can realize accurate and easy alignment is useful. The surface mounting type light receiving module is configured such that the incident light from the optical fiber cable is parallel to the mount substrate of the semiconductor light receiving device.

As a semiconductor light receiving device suitable for a surface mounting type light receiving module, for example, as in Patent Document #1, a light receiving section for converting optical signals into electric signals is provided on the front surface side of a semiconductor substrate, and an incident light entered from an edge of the semiconductor substrate enters to the light receiving section by reflection or refraction. There is known an edge incident type semiconductor light receiving device that reflects or refracts light to enter a light receiving section. Since the edge incident type semiconductor light receiving device can be fixed to the mount substrate without using a submount substrate for fixing the main surface side of the semiconductor substrate toward the optical fiber cable, it is easy to manufacture a surface mount type light receiving module, and it is possible to reduce the manufacturing cost.

PRIOR ART DOCUMENTS

Patent Documents

Patent Document #1: Japanese Patent Publication 3152907.

SUMMARY OF THE INVENTION

Problems to be Solved by the Invention

By the way, not only infrared light having a wavelength of about 1000 nm or more that is not absorbed by the semiconductor substrate of the semiconductor light receiving device but also light having a wavelength of less than 1000 nm that is absorbed by the semiconductor substrate is used for the optical signal of the optical communication. In other words, the semiconductor substrate is transparent to light having a long wavelength of approximately 1000 nm or more, but is opaque to light having a short wavelength of less than 1000 nm, and there are cases where the semiconductor light receiving device receives the light having this short wavelength.

However, the edge incident type semiconductor light receiving device as disclosed in Patent Document #1 is configured so that light travels in the semiconductor substrate. Therefore, when light of a wavelength absorbed by the semiconductor substrate is used, the light is attenuated by the opaque semiconductor substrate and does not reach the light receiving section, so that the edge incident type semiconductor light receiving device cannot be applicable.

An object of the present invention is to provide an edge incident type semiconductor light receiving device that can be applicable even when the semiconductor substrate is opaque to incident light.

Means to Solve the Problems

The present invention presents an edge incident type semiconductor light receiving device, which has a light receiving section on a main surface side of a semiconductor substrate and reflects a light incident in parallel to the main surface to enter the light receiving section; wherein a light guide section is formed to expose the light receiving section along a light incident direction from a light incident side end of the semiconductor substrate, and in order to guide the light incident in the light guide section to the light receiving section, a reflection section having a predetermined intersection angle with the main surface is provided at an end section of the light guide section in the light incident direction.

According to the above configuration, the light receiving section is exposed to the light guide section through which the incident light passes, and the incident light is not absorbed in the light guide section because there is no semiconductor substrate in the light guide section. Then, a reflection section having a predetermined crossing angle with respect to the main surface is provided at an end section of the light guide section in the light incident direction so as to guide the incident light to the light receiving section. Therefore, since most of the incident light can be reflected by the reflection section, the light attenuation can be suppressed and the light can be guided to the light receiving section, and the edge incident type semiconductor light receiving device can be applied for the light of the wavelength absorbed by the semiconductor substrate.

In a preferable first aspect of the present invention, the semiconductor substrate is a III-V group compound semiconductor substrate that absorbs incident light, and the reflection section is configured to reflect incident light toward the light receiving section.

According to the above configuration, it is possible to prevent the light having the wavelength absorbed by the III-V compound semiconductor substrate from being absorbed by the light guide section until being reflected by the reflection section and incident on the light receiving section. Therefore, the edge incident type semiconductor light receiving device can be applied even for light having a wavelength absorbed by the semiconductor substrate.

In a preferable second aspect of the present invention, the semiconductor substrate is a group IV semiconductor substrate that absorbs incident light, a mount substrate having a mount substrate reflection section facing the light guide section is provided on a back surface side of the semiconductor substrate, and the light reflected by the reflection section is reflected toward the mount substrate reflection section, and the mount substrate reflection section is configured to reflect the light reflected by the reflection section toward the light receiving section.

According to the above configuration, light having a wavelength absorbed by the group IV semiconductor substrate can be prevented from being absorbed by the light guide section until being reflected by the mount substrate reflection section and incident on the light receiving section. Therefore, the edge incident type semiconductor light receiving device can be used even for light having a wavelength absorbed by the semiconductor substrate.

In a preferable third aspect of the present invention, the reflection section is formed on a (111) surface of the semiconductor substrate.

According to the above configuration, the inclination angle of the reflection section is automatically determined, and a smooth reflection section having a high reflectance can be formed, so that the light receiving sensitivity can be improved.

In a preferable fourth aspect of the present invention, the light receiving section has an antireflection film on a side facing the light guide section.

According to the above configuration, the reflection when light enters the light receiving section from the light guide section is reduced by the antireflection film, and most of the incident light can reach the light receiving section, thus the light receiving sensitivity can be improved.

Advantages of the Invention

The edge incident type semiconductor light receiving device of the present invention can be used even when the semiconductor substrate is opaque to the incident light.

DESCRIPTION OF EMBODIMENTS

Best mode for implementing the present invention will now be explained on the basis of embodiments.

First Embodiment

Figure 1:
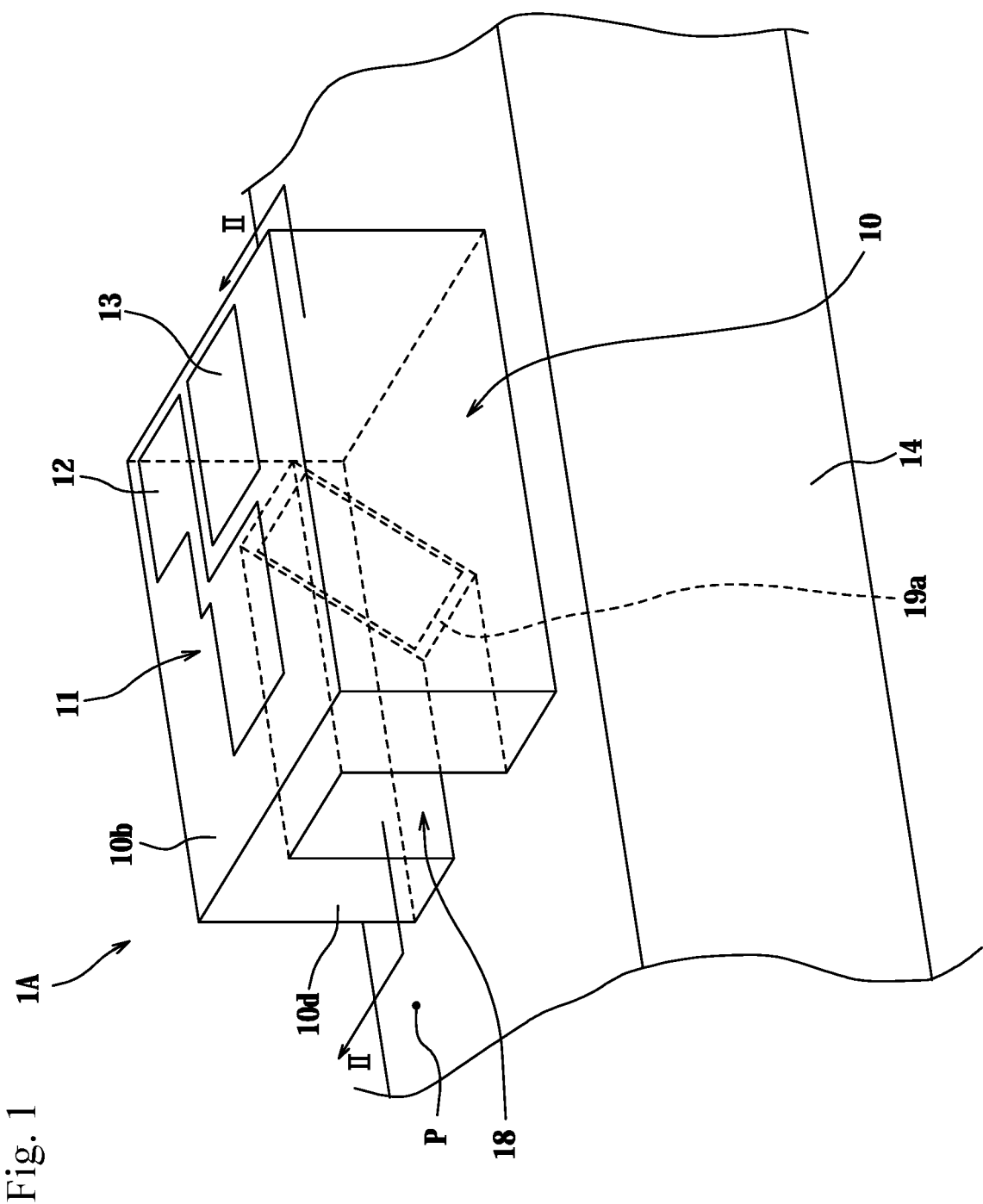
FIG. 1 is an external view of an edge incident type semiconductor light receiving device according to a first embodiment of the present invention.
Figure 2:
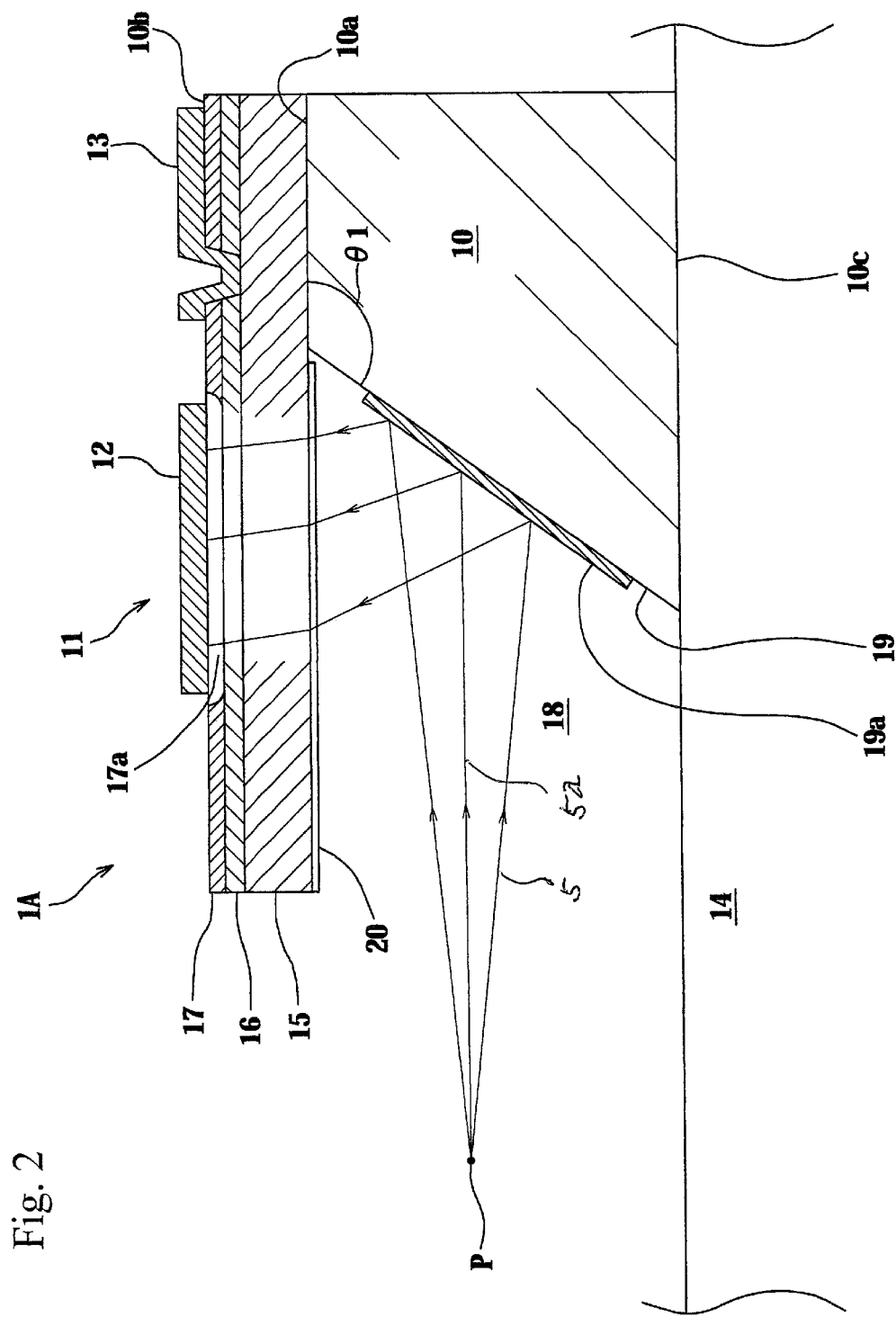
FIG. 2 is a sectional view taken along line II-II of FIG. 1.

FIG. 1 and FIG. 2 show an edge incident type semiconductor light receiving device 1A using a GaAs substrate which is a III-V group compound semiconductor substrate as the semiconductor substrate 10.

The edge incident type semiconductor light receiving device 1A has a (100) surface of the semiconductor substrate 10 as a main surface 10a and a light receiving section 11 for converting optical signals into electric signals on the main surface 10a side.

Further, the edge incident type semiconductor light receiving device 1A has a pair of electrodes 12 and 13 on the surface 10b on the main surface 10a side for taking out the electric signals converted by the light receiving section 11 to the outside. The semiconductor substrate 10 is fixed to the mount substrate 14 with the back surface 10c facing the main surface 10a.

In the light receiving section 11, an n-AlGaAs layer 15, an i-GaAs layer 16, and an n-AlGaAs layer 17 are sequentially formed on the main surface 10a of the semiconductor substrate 10, and a p-type diffusion region 17a is formed in a section of the n-AlGaAs layer 17 so as to form a photodiode. Further, electrodes 12 and 13 electrically connected to the n-AlGaAs layer 15 and the p-type diffusion region 17a of the light receiving section 11 are formed, respectively.

Light emitted from the optical fiber cable on one end face 10d side out of the four end faces other than the front face 10b and the back face 10c enters the edge incident type semiconductor light receiving device 1A in parallel to the main face 10a. Let this emission point be P. A light guide section 18 is formed by removing a section of the semiconductor substrate 10a along the light incident direction from the end surface 10d (incident side end section) of the semiconductor substrate 10 facing the emission point P.

A reflection section 19a having a predetermined crossing angle $\theta 1$ with respect to the main surface 10a is formed at an end section of the light guide section 18 in the light incident direction. The reflection section 19a is formed on the (111) surface 19 of the semiconductor substrate 10 exposed by the formation of the light guide section 18, for example, by a reflection film having a metal film mainly including an Au film as a reflection surface. The exposed (111) plane 19 of the semiconductor substrate 10 is a smooth surface composed of As of the V group element, and is continuous with the main surface 10a at an obtuse angle of a predetermined intersection angle $\theta 1$ ($\theta 1 = 125.3°$). Therefore, the reflection section 19a has a high reflectance due to the smooth reflecting surface and also has a predetermined crossing angle $\theta 1$ with respect to the main surface 10a.

The n-AlGaAs layer 15 of the light receiving section 11 is exposed to the light guide section 18 by forming the light guide section 18. The reflection section 19a is configured to reflect the incident light toward the exposed n-AlGaAs layer 15 of the light receiving section 11. Then, so that most of the light reflected toward the n-AlGaAs layer 15 of the light receiving section 11 reaches the light receiving section 11, the reflection when entering the n-AlGaAs layer 15 facing the light guide section 18 is prevented by an antireflection film 20. The antireflection film 20 is formed so as to cover the exposed n-AlGaAs layer 15. The antireflection film 20 is, for example, a SiN film and has a thickness of ¼ of the wavelength of incident light (for example, a thickness of about 210 nm for light having a wavelength of 850 nm). The antireflection film 20 may be omitted.

The light 5 emitted from the emission point P, including light 5a parallel to the main surface 10a, reaches the reflection section 19a through the light guide section 18 while spreading as shown by the broken line with an arrow, and is directed to the light receiving section 11 by the reflection section 19a. Since there is no semiconductor substrate 10 that absorbs light in the optical path to the light receiving section 11 of the edge incident type semiconductor light receiving device 1A, the edge incident type semiconductor light receiving device 1A can be applied for the light of the wavelength absorbed by the semiconductor substrate 10.

Figure 3:
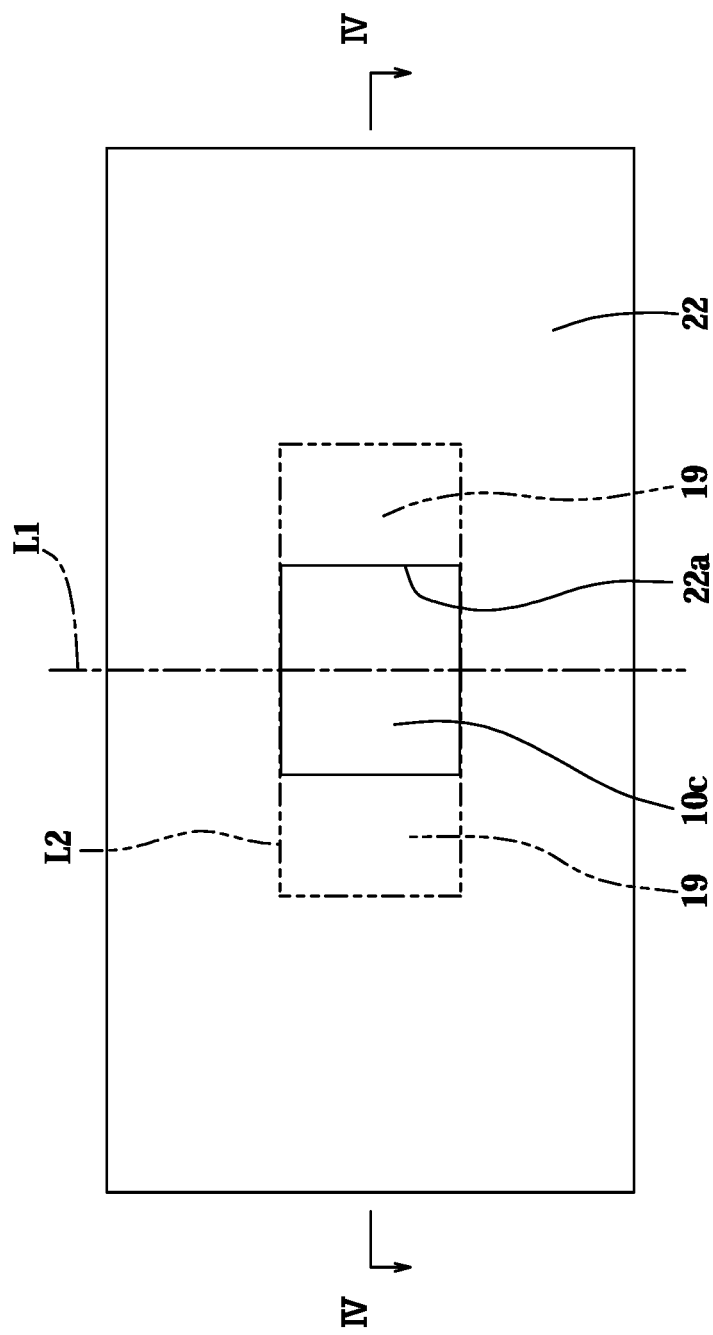
FIG. 3 is a diagram showing the back surface of the semiconductor substrate after the etching mask forming step.
Figure 4:
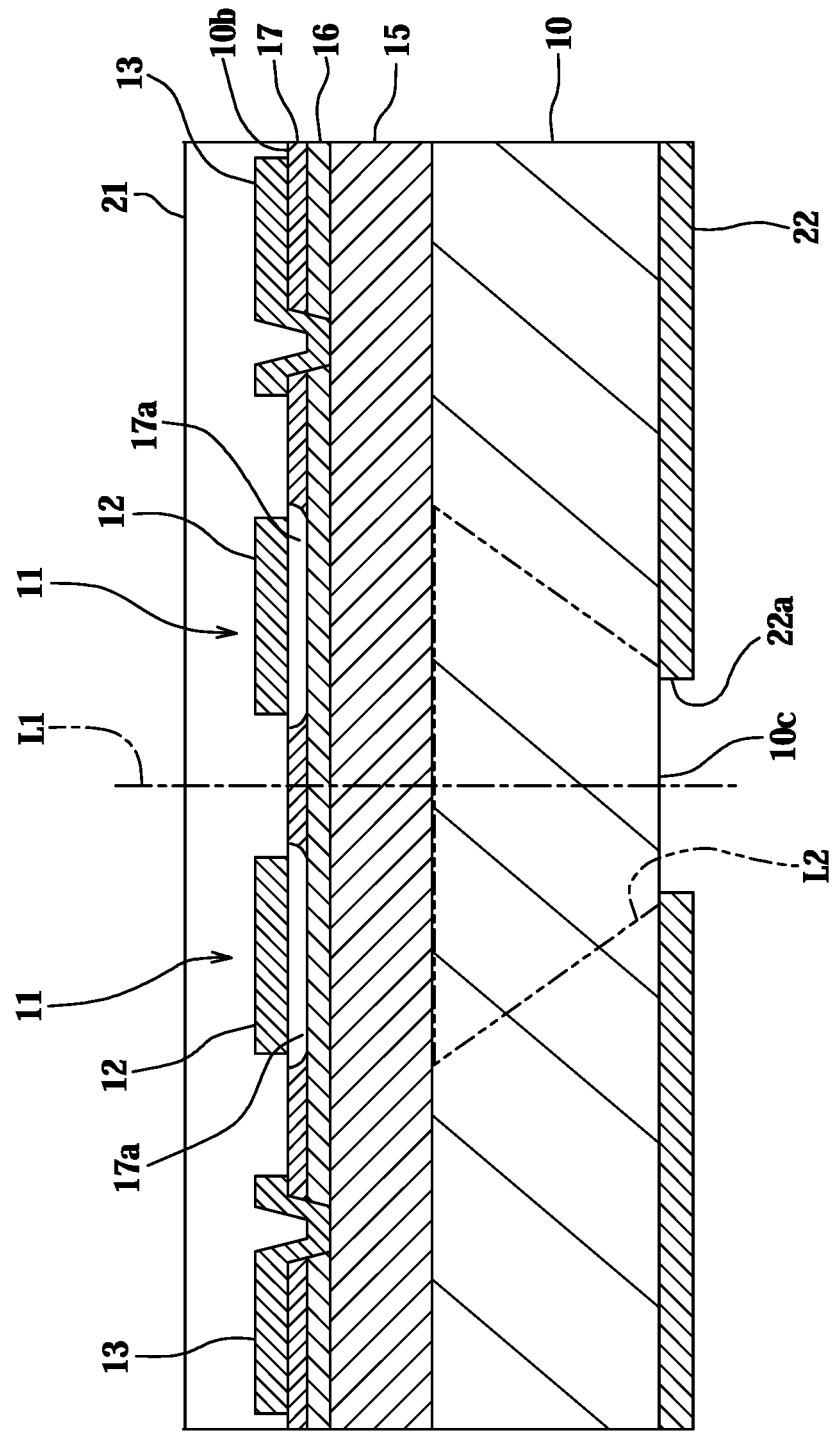
FIG. 4 is a sectional view taken along line IV-IV of FIG. 3.

Next, a method of forming the light guide section 18 will be described with reference to FIGS. 3 and 4.

The light receiving section 11 and the electrodes 12 and 13 are formed on the side of the main surface 10a, and a photoresist layer, for example, is formed as the protective layer 21 on the surface 10b of the semiconductor substrate 10 processed to have an appropriate thickness (for example, 150 μm) (protection layer forming step). On this semiconductor substrate 10, two light receiving sections 11 are formed symmetrically with respect to the straight line L1.

Further, a dielectric layer 22 (for example, a $SiO_2$ layer or a SiN layer) is formed as an etching mask on the back surface 10c of the semiconductor substrate 10, and in a predetermined region of the back surface 10c of the semiconductor substrate 10 (corresponding to between the two light receiving sections 11), a rectangular opening 22a exposing an area is formed (etching mask forming step). Here, by appropriately selecting the direction in which the two light receiving sections 11 are arranged, the semiconductor substrate 10 can be etched from the opening 22a so that the (111) plane of the semiconductor substrate 10 faces the light receiving section 11.

A section of the semiconductor substrate 10 is removed from the opening 22a as shown by a line L2 by anisotropic etching using, for example, a mixed solution of hydrogen bromide and methanol as an etching solution. As a result, the n-AlGaAs layer 15 of the light receiving section 11 and the (111) surface 19 of the semiconductor substrate 10 are exposed to form a space to be the light guiding section 18 (substrate etching step). The etching depth can be controlled by the etching time.

The reflection section 19a is formed on the (111) surface 19 of the semiconductor substrate 10 facing the light guide section 18 (reflection section forming step), and the antireflection film 20 is formed on the n-AlGaAs layer 15 exposed in the light guide section 18. (antireflection film forming step). For example, in a state where a protective layer is formed on the n-AlGaAs layer 15 exposed to the light guide section 18, a dielectric film ($SiO_2$ film) or a metal reflective film (Au film) is formed on the (111) surface 19 of the semiconductor substrate 10. The films are sequentially formed to form the reflection section 19a. After removing the protective layer, an antireflection film 20 (SiN film) is formed on the n-AlGaAs layer 15 exposed in the light guide section 18.

Finally, the semiconductor substrate 10 from which the dielectric layer 22 on the back surface 10c and the protective layer 21 on the front surface 10b are removed is divided along the straight line L1 (dicing step) and fixed to the mount substrate 14 (mounting step), respectively. The edge incident type semiconductor light receiving device 1A shown in FIGS. 1 and 2 is obtained. Although the rear surface 10c side of the semiconductor substrate 10 is fixed to the mount substrate 14, the front surface 10b side may be fixed. Further, the reflection section forming step and the antireflection film forming step may be performed between the dicing step and the mounting step.

Figure 5:
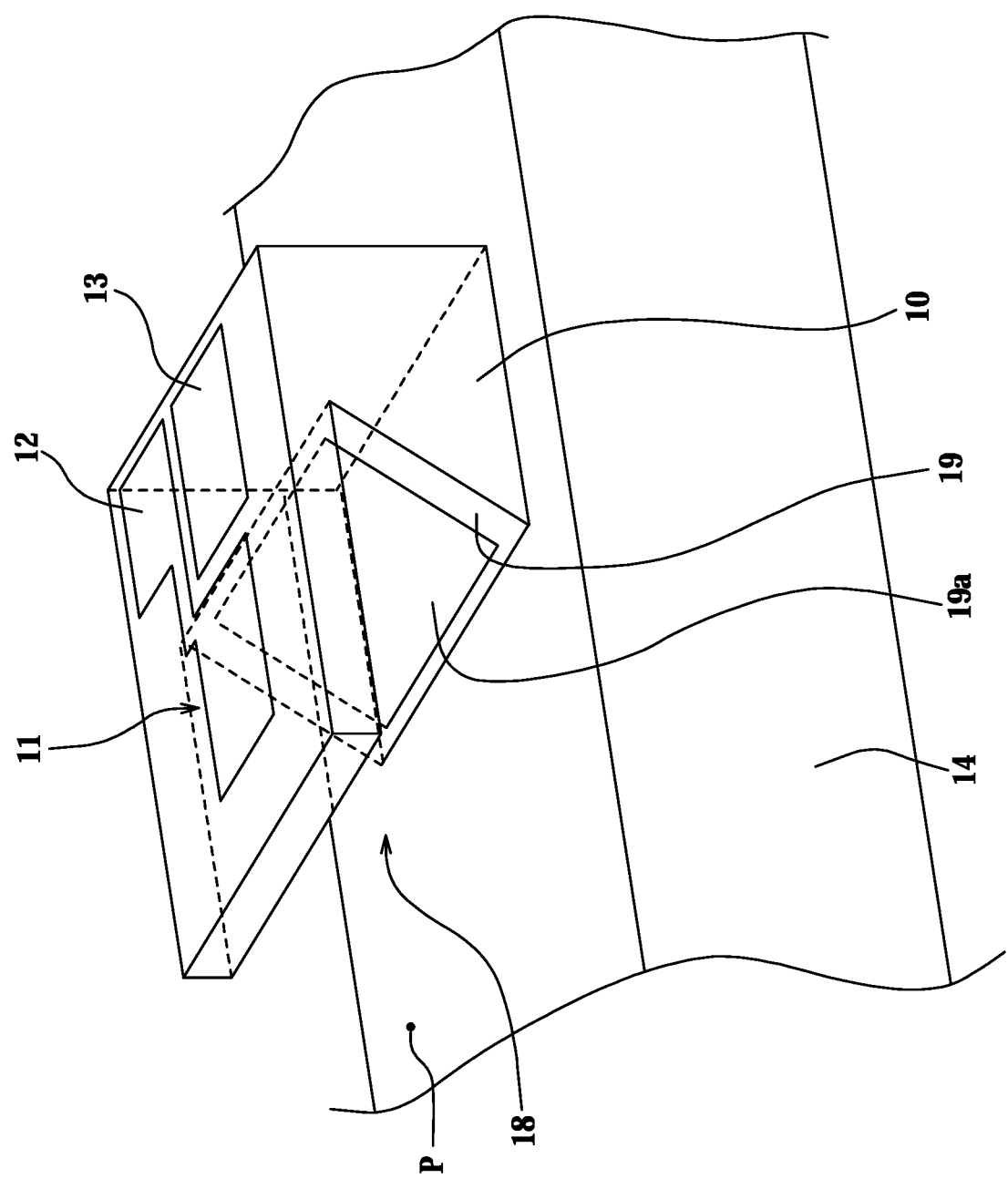
FIG. 5 is a diagram showing a modified example of the edge incident type semiconductor light receiving device of FIG. 1.

The emission end of an optical fiber cable (not shown) is fixed at the position of the emission point P with respect to the edge incident type semiconductor light receiving device 1A. At this time, in order to prevent displacement of the optical fiber cable, the light guide section 18 may be filled with a transparent synthetic resin for incident light from the optical fiber cable to the reflection section 19a. As shown in FIG. 5, the light guide section 18 may be formed over the entire incident side end of the semiconductor substrate 10. Although not shown, the light receiving section 11 is supported from one side along the incident direction. The light guide section 18 may be formed by removing a section of the incident side end section of the semiconductor substrate 10.

Second Embodiment

Figure 6:
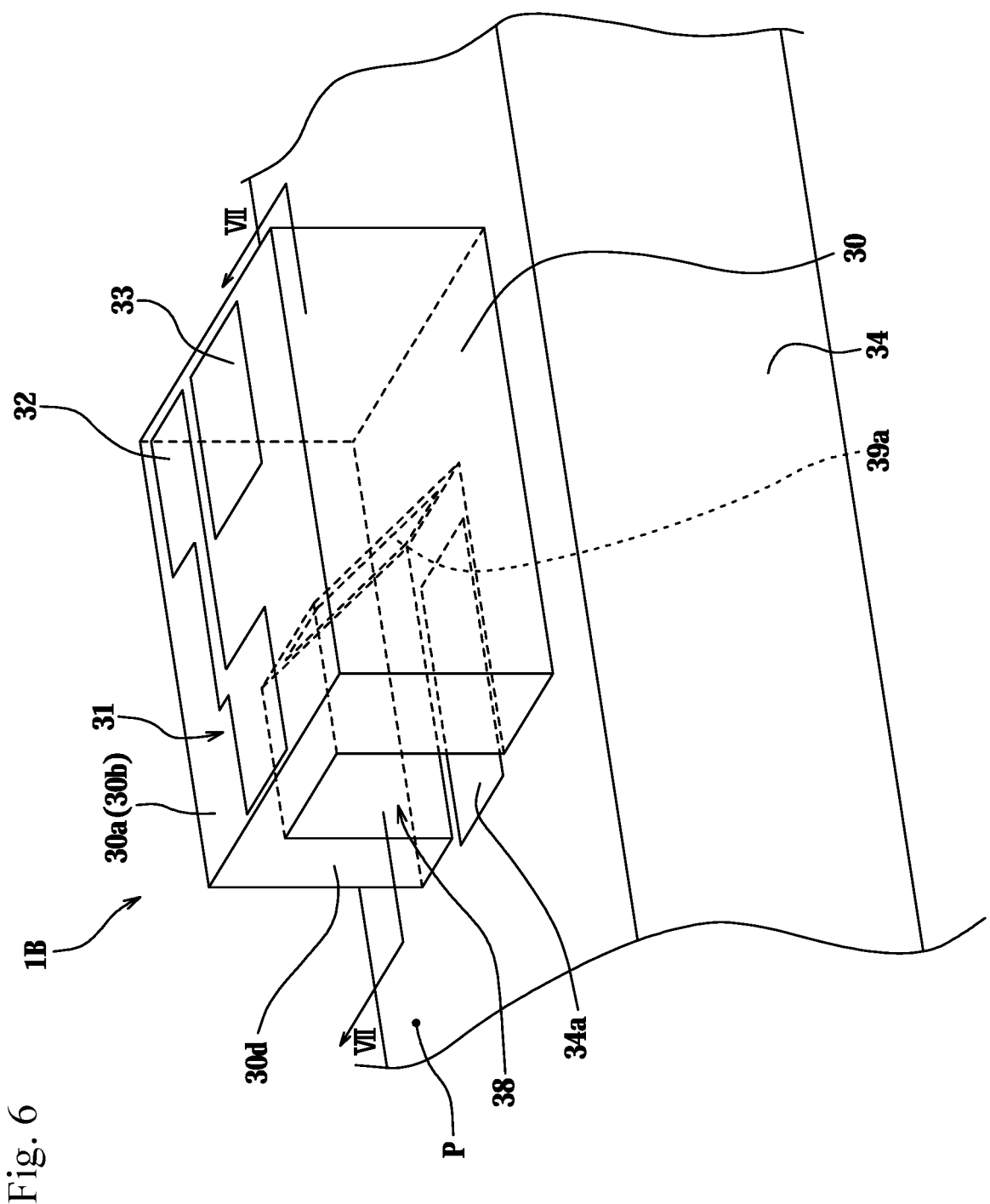
FIG. 6 is an external view of an edge incident type semiconductor light receiving device according to a second embodiment of the present invention.
Figure 7:
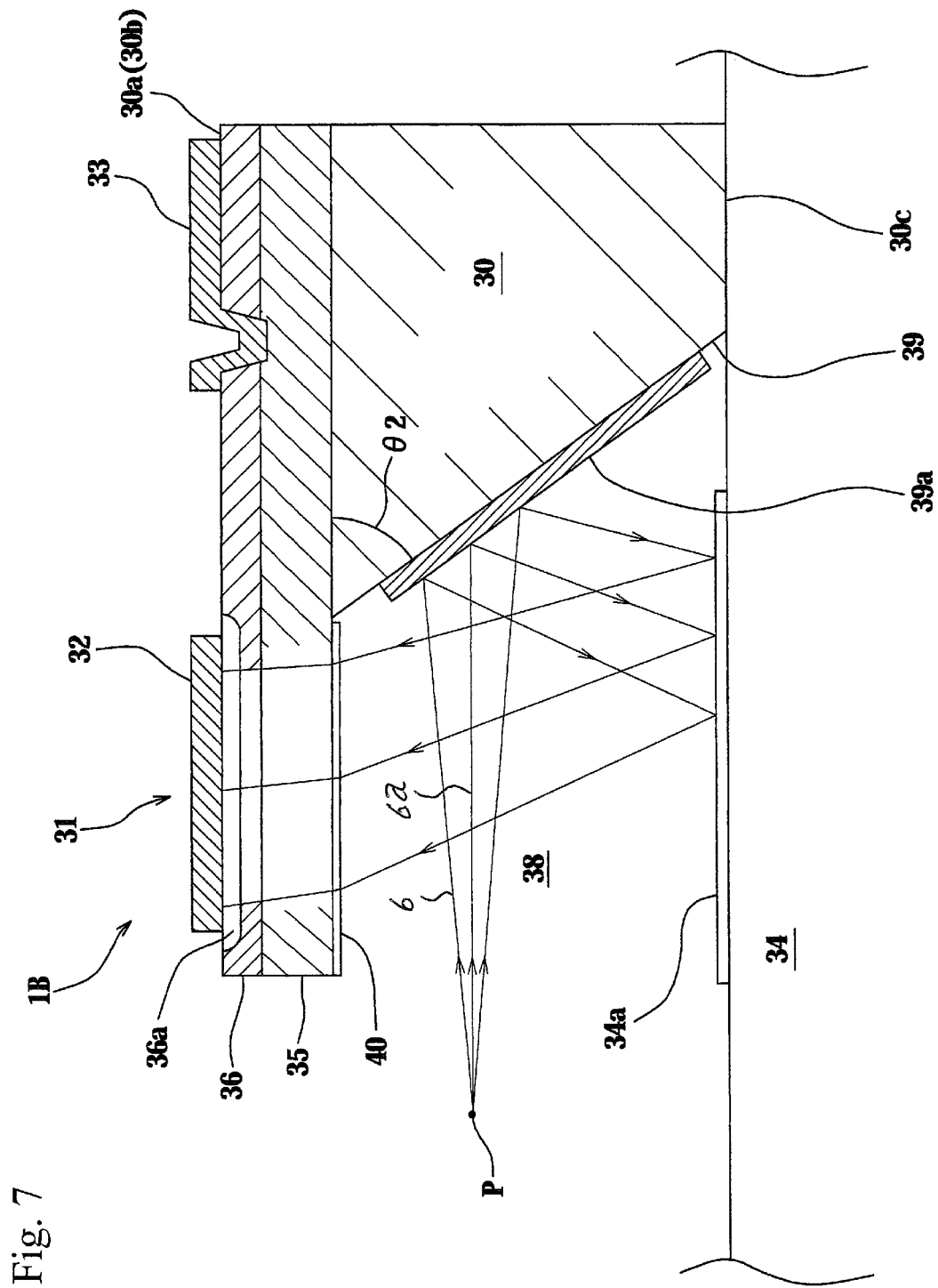
FIG. 7 is a sectional view taken along line VII-VII of FIG. 6.

FIG. 6 and FIG. 7 show an edge incident type semiconductor light receiving device 1B using an n-Si substrate which is a group IV semiconductor substrate as the semiconductor substrate 30. The edge incident type semiconductor light receiving device 1B has a (100) surface of the semiconductor substrate 30 as a main surface 30a and a light receiving section 31 for converting optical signals into electric signals on the main surface 30a side.

A front surface 30b (main surface 30a) of the semiconductor substrate 30 is provided with a pair of electrodes 32 and 33 for taking out the electric signal converted by the light receiving section 31 to the outside. The semiconductor substrate 30 is fixed to the mount substrate 34 with the back surface 30c facing the main surface 30a. The mount substrate 34 is, for example, a ceramic substrate, and has a mirror-processed mount substrate reflecting section 34a on the surface to which the semiconductor substrate 30 is fixed. The mount substrate reflection section 34a is formed of, for example, a reflecting film having a reflecting surface mainly made of a metal film including an Au film.

The light receiving section 31 has an n+ diffusion layer 35 doped with, for example, P (phosphorus) or the like in a predetermined depth range from the surface 30b of the semiconductor substrate 30. A p-type diffusion region 36a doped with, for example, B (boron) is formed in a sectional region of the n-Si layer 36 on the surface 30b side of the n+ diffusion layer 35. The light receiving section 31 is a photodiode composed of the n+ diffusion layer 35, the n-Si layer 36, and the p-type diffusion region 36a. Further, electrodes 32 and 33 electrically connected to the n+ diffusion layer 35 and the p-type diffusion region 36a of the light receiving section 31 are formed, respectively.

Light emitted from the optical fiber cable on one end face 30d side out of the four end faces other than the front surface 30b and the back surface 30c is incident on the edge incident type semiconductor light receiving device 1B in parallel to the main surface 30a. With this emission point as P, the light guide section 38 is formed by removing a section of the semiconductor substrate 30 along the light incident direction from the end surface 30d (incident side end section) of the semiconductor substrate 30 facing the emission point P.

A reflection section 39a having a predetermined crossing angle θ2 with respect to the main surface 30a is formed at an end section of the light guide section 38 in the light incident direction. The reflecting section 39a is formed on the (111) surface 39 of the semiconductor substrate 30 exposed by the formation of the light guide section 38, for example, by a reflecting film having a metal film mainly including an Au film as a reflecting surface. The (111) plane 39 of the exposed semiconductor substrate 30 is a smooth surface, intersects the main surface 30a at a predetermined intersection angle θ2 (θ2=54.7°), and is continuous with the back surface 30c at an obtuse angle of 125.3°. Therefore, the reflection section 39a has a high reflectance due to the smooth reflecting surface and has a predetermined crossing angle θ2 with respect to the main surface 30a.

The n+ diffusion layer 35 of the light receiving section 31 is exposed to the light guide section 38 by forming the light guide section 38. The reflection section 39a is configured to reflect the incident light toward the mount substrate reflection section 34a on the side opposite to the exposed light receiving section 31. In order to make most of the light reflected toward the n+ diffusion layer 35 of the light receiving section 31 reach the light receiving section 31, an antireflection film 40 for preventing reflection when entering the n+ diffusion layer 35 facing the light guide section 38 is formed so as to cover the exposed n+ diffusion layer 35. The antireflection film 40 is, for example, a SiN film and has a thickness of about ¼ of the wavelength of incident light (for example, a thickness of about 210 nm for light having a wavelength of 850 nm).

Light 6 emitted from the emission point P, including light 6a parallel to the main surface 30a, reaches the reflection section 39a through the light guide section 38 while spreading as shown by the broken line with an arrow, and it is reflected toward the mount substrate reflection section 34a on the opposite side to the light receiving section 31. The light reflected by the reflection section 39a is reflected by the mount substrate reflecting section 34a toward the light receiving section 31, and reaches the light receiving section 31. Since there is no semiconductor substrate 30 that absorbs light in the optical path extending to the light receiving section 31 of the edge incident type semiconductor light receiving device 1B, the edge incident type semiconductor light receiving device 1B can be applied for light having a wavelength absorbed by the semiconductor substrate 30.

Figure 8:
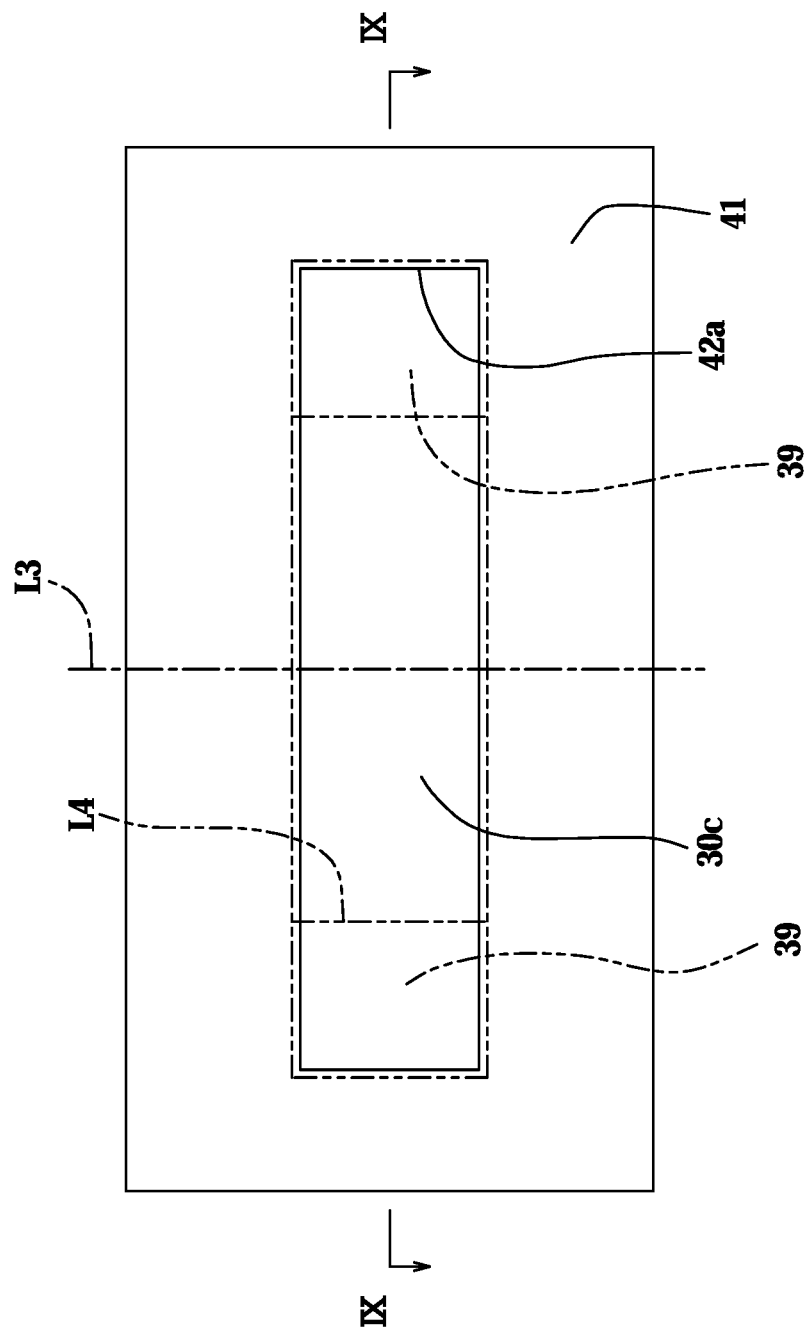
FIG. 8 is a diagram showing the back surface of the semiconductor substrate after the etching mask forming step.
Figure 9:
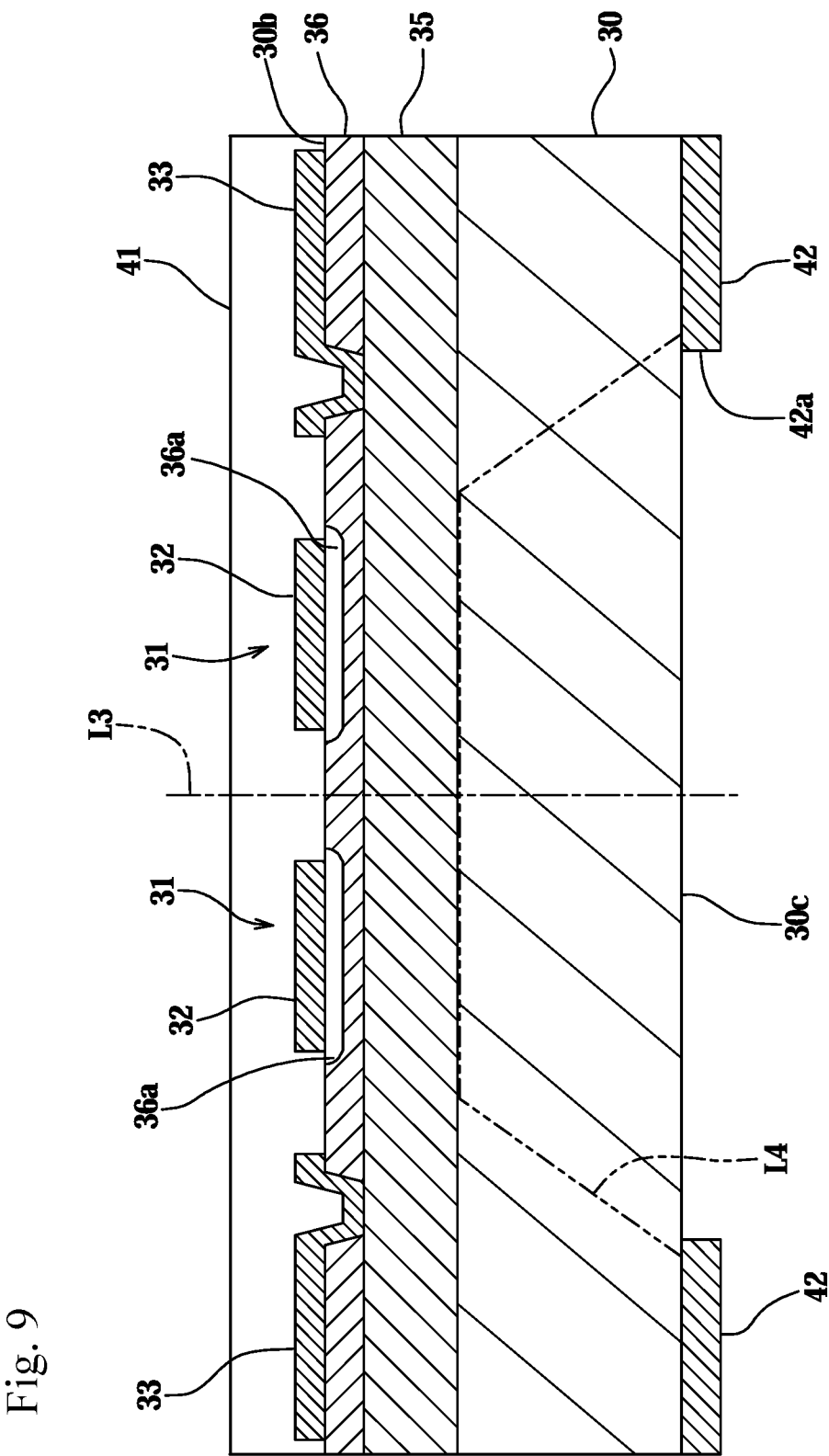
FIG. 9 is a sectional view taken along line IX-IX of FIG. 8.

Next, a method of forming the light guide section 38 will be described with reference to FIG. 8 and FIG. 9.

The light receiving section 31 and the electrodes 32 and 33 are formed on the main surface 30a side, and a photoresist layer, for example, is formed as the protective layer 41 on the surface 30b of the semiconductor substrate 30 processed to have an appropriate thickness (for example, 150 μm) (protection layer forming step). On this semiconductor substrate 30, two light receiving sections 31 are formed symmetrically with respect to the straight line L3.

In addition, a dielectric layer 42 (for example, a SiO₂ film or a SiN film) is formed as an etching mask on the back surface 30c of the semiconductor substrate 30, and in a predetermined region (two light receiving sections 31 and between them) of the back surface 30c of the semiconductor substrate 30, a rectangular opening 42a exposing the corresponding region is formed (etching mask forming step). Here, by appropriately selecting the direction in which the two light receiving sections 31 are arranged, the semiconductor substrate 10 is etched from the opening 42a so that the (111) plane of the semiconductor substrate 30 faces the side opposite to the light receiving section 31.

A section of the semiconductor substrate 30 is removed from the opening 42a as indicated by the line L4 by anisotropic etching using, for example, a KOH aqueous solution as an etching liquid. As a result, the n+ diffusion layer 35 of the light receiving section 31 and the (111) surface 39 of the semiconductor substrate 30 are exposed to form a space to be the light guide section 38 (substrate etching step). The etching depth can be controlled by the etching time.

The reflection section 39a is formed on the (111) surface 39 of the semiconductor substrate 30 facing the light guide section 38 (reflection section forming step), and the antireflection film 40 is formed on the n+ diffusion layer 35 exposed to the light guide section 38 (antireflection film forming step). For example, in the state where a protective layer is formed on the n+ diffusion layer 35 exposed to the light guide section 38, a dielectric film (SiO₂ film) and a metal reflection film (Au film) are formed in this order on the (111) surface 39 of the semiconductor substrate 30. The reflection section 39a is formed by film formation. After removing the protective layer, an antireflection film 40 (SiN film) is formed on the n+ diffusion layer 35 exposed in the light guide section 38. The antireflection film 40 may be omitted.

Finally, the semiconductor substrate 30 from which the dielectric layer 42 on the back surface 30c and the protective layer 41 on the front surface 30b are removed is divided along the straight line L3 (dicing step) and fixed to the mount substrate 34 (mounting step). Thus, the edge incident type semiconductor light receiving device 1B of FIGS. 6 and 7 is obtained. The reflection section forming step and the antireflection film forming step may be performed between the dicing step and the mounting step.

Figure 10:
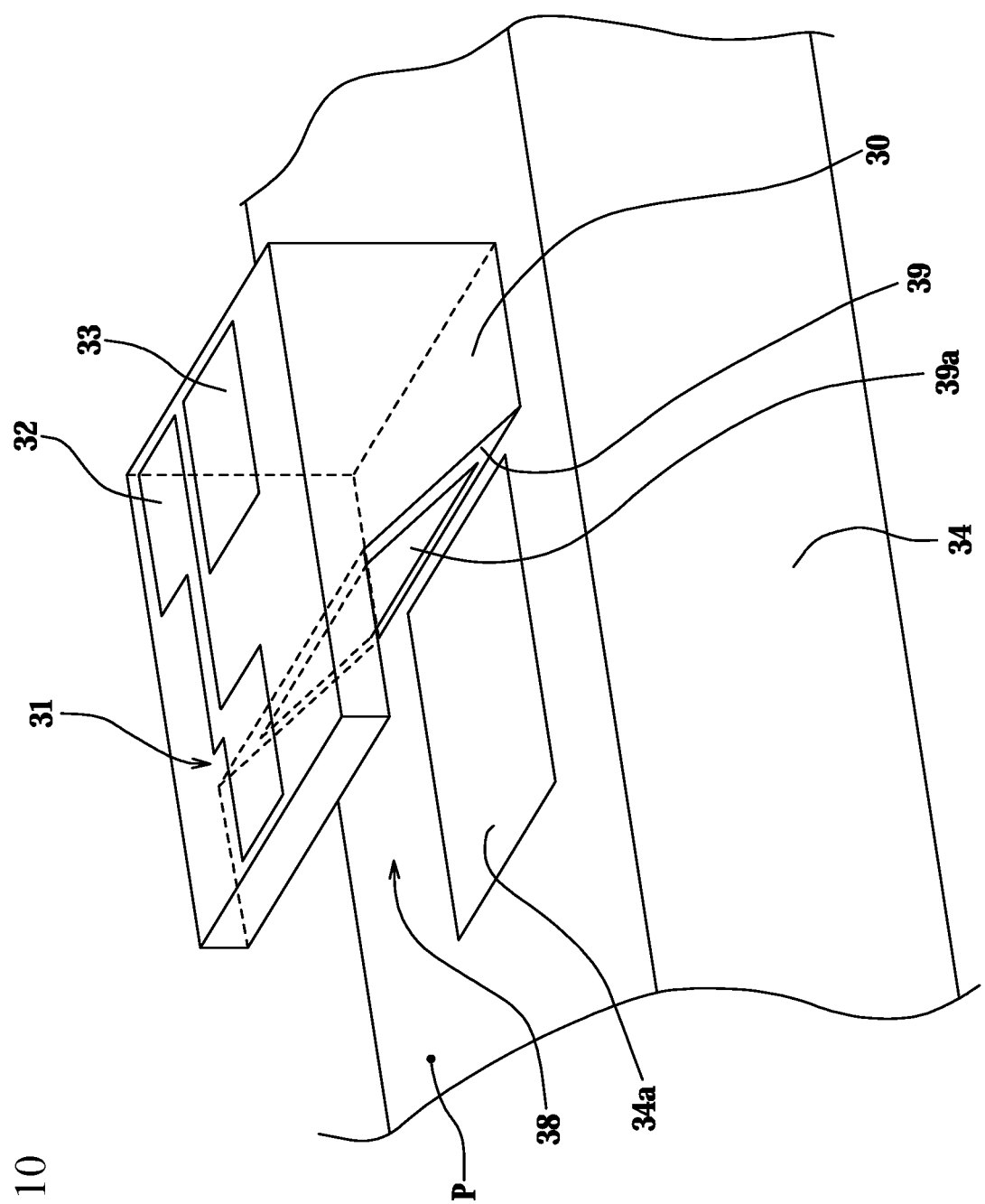
FIG. 10 is a diagram showing a modification of the edge incident type semiconductor light receiving device of FIG. 6.

The emission end of an optical fiber cable (not shown) is fixed at the position of the emission point P with respect to the edge incident type semiconductor light receiving device 1B. At this time, in order to prevent displacement of the optical fiber cable, the light guide section 38 may be fixed by filling the light guide section 38 from the optical fiber cable to the reflecting section 39a with transparent resin for incident light. As shown in FIG. 10, the light guide section 38 may be formed on the entire incident side end of the semiconductor substrate 30, and although not shown, the light receiving section 31 is supported from one side along the incident direction. The light guide section 38 may be formed by removing a section of the incident side end section of the semiconductor substrate 30.

The operation and effect of the edge incident semiconductor light receiving devices 1A and 1B will be described.

The light receiving sections 11 and 31 are exposed to the light guides 18 and 38 through which the light incident on the edge incident type semiconductor light receiving devices 1A and 1B passes, and the semiconductor substrates 10 and 30 are not present in the light guide sections 18 and 38, so the light is not absorbed and is not attenuated. Then, at the end sections of the light guide sections 18 and 38 in the light incident direction, the reflection sections 19a and 39a having predetermined crossing angles θ1 and θ2 with respect to the main surfaces 10a and 30a for guiding the light to the light receiving sections 18 and 38, 39a. Therefore, most of the incident light can be reflected by the reflection sections 19a and 39a, so that the light can be guided to the light receiving sections 11 and 31 while suppressing the attenuation of the light, is absorbed. Also, the edge incident type semiconductor light receiving devices 1A and 1B can be applied for the light of the wavelength to be absorbed in the semiconductor substrates 10 and 30.

The edge incident type semiconductor light receiving device 1A can prevent the light having a wavelength absorbed by the III-V group compound semiconductor substrate from being absorbed by the light guide section 18 until it is reflected by the reflection section 19a and is incident on the light receiving section 11. Therefore, the edge incident type semiconductor light receiving device 1A can be applied for light having a wavelength absorbed by the semiconductor substrate 10.

The edge incident type semiconductor light receiving device 1B can prevent the light having a wavelength absorbed by the group IV semiconductor substrate from being absorbed by the light guide section 38 until it is reflected by the reflecting section 39*a* and the mount substrate reflection section 34*a* and is incident on the light receiving section 31. Therefore, the edge incident type semiconductor light receiving device 1B can be applied for the light of the wavelength absorbed by the semiconductor substrate 30.

Since the reflection sections 19*a* and 39*a* are formed on the (111) planes 19 and 39 of the semiconductor substrates 10 and 30, the inclination angles of the reflection sections 19*a* and 39*a* with respect to the main surfaces 10*a* and 30*a* are automatically determined, and it is possible to form the smooth reflection sections 19*a* and 39*a* having a high reflectance. Therefore, the deviation of the incident position of the light due to the deviation of the tilt angle is reduced, and the reflecting sections 19*a* and 39*a* having high reflectance can be formed, so that the light receiving sensitivity can be improved.

Since the light receiving sections 11 and 31 have the antireflection films 20 and 40 on the side facing the light guiding sections 18 and 38, reflection when light travels through the light guide sections 18 and 38 and enters the light receiving sections 11 and 31 can be reduced by the antireflection films 20 and 40. Therefore, most of the incident light can reach the light receiving sections 11 and 31, and the light receiving sensitivity can be improved.

In addition, those skilled in the art can implement various modifications to the above described embodiments without departing from the spirit of the present invention, and the present invention also includes such modifications.

DESCRIPTION OF REFERENCE NUMERALS 1A, 1B: edge incident type semiconductor light receiving device
10, 30: semiconductor substrate
10*a*, 30*a*: main surface
10*b*, 30*b*: surface
10*c*, 30*c*: back side
10*d*, 30*d*: end surface
11, 31: light receiving section
12, 13, 32, 33: electrodes
14, 34: mount substrate
15, 17: n-AlGaAs layer
16: i-GaAs layer
17*a*: p-type diffusion region
18, 38: light guide section
19, 39: (111) plane
19*a*, 39*a*: reflection sections
20, 40: antireflection film
21, 41: protective layer
22, 42: dielectric layer
22*a*, 42*a*: openings
34*a*: mounted substrate reflection section
35: n+ diffusion layer
36: n-layer
36*a*: p-type diffusion region

The invention claimed is:

1. An edge incident type semiconductor light receiving device, which has a light receiving section on a main surface side of a semiconductor substrate and reflects light incident including light parallel to the main surface, to enter the light receiving section; wherein
a light guide section is formed to expose the light receiving section along a light incident direction from a light incident side end of the semiconductor substrate,
in order to guide light incident in the light guide section to the light receiving section, a reflection section having a predetermined intersection angle with the main surface is provided at an end section of the light guide section in the light incident direction,
the semiconductor substrate is a group IV semiconductor substrate that absorbs incident light,
a mount substrate having a mount substrate reflection section facing the light guide section is provided on a back surface side of the semiconductor substrate, and
light reflected by the reflection section is reflected toward the mount substrate reflection section, and the mount substrate reflection section is configured to reflect the light reflected by the reflection section toward the light receiving section.

2. The edge incident type semiconductor light receiving device according to claim 1; wherein the reflection section is formed on a (111) surface of the semiconductor substrate.

3. The edge incident type semiconductor light receiving device according to claim 1; wherein the light receiving section has an antireflection film on a side facing the light guide section.

* * * * *